(12) United States Patent
Vargas

(10) Patent No.: US 9,699,936 B1
(45) Date of Patent: Jul. 4, 2017

(54) CABLE MANAGEMENT ASSEMBLY

(71) Applicant: EMC Corporation, Hopkinton, MA (US)

(72) Inventor: Matthew Vargas, Menlo Park, CA (US)

(73) Assignee: EMC IP Holding Co., LLC, Hopkinton, MA (US)

(*) Notice: Subject to any disclaimer, the term of this patent is extended or adjusted under 35 U.S.C. 154(b) by 0 days.

(21) Appl. No.: 15/056,072

(22) Filed: Feb. 29, 2016

(51) Int. Cl.
| H02B 1/20 | (2006.01) |
| H05K 7/18 | (2006.01) |
| H02G 3/32 | (2006.01) |
| A47B 97/00 | (2006.01) |
| H05K 5/02 | (2006.01) |
| H04Q 1/06 | (2006.01) |
| H01R 9/24 | (2006.01) |
| H01R 35/04 | (2006.01) |
| H02G 11/00 | (2006.01) |

(52) U.S. Cl.
CPC ........ *H05K 7/183* (2013.01); *A47B 2097/003* (2013.01); *H01R 9/2416* (2013.01); *H01R 9/2475* (2013.01); *H01R 35/04* (2013.01); *H02G 3/32* (2013.01); *H02G 11/00* (2013.01); *H04Q 1/06* (2013.01); *H05K 5/0247* (2013.01)

(58) Field of Classification Search
CPC .... H01R 9/2416; H01R 35/04; H01R 9/2475; H04Q 1/06; H05K 7/1491; H05K 5/0247; H05K 7/183; H02G 3/32; H02G 11/00; A47B 2097/003

USPC ................... 361/807, 826; 248/74.2
See application file for complete search history.

(56) References Cited

U.S. PATENT DOCUMENTS

| 6,791,841 B1 * | 9/2004 | Tirrell .................. H05K 5/0247 361/724 |
| 8,040,692 B2 * | 10/2011 | Hetzer ..................... H04Q 1/06 361/810 |
| 2004/0035983 A1 * | 2/2004 | Simonson ............ H02G 15/007 248/49 |
| 2007/0190815 A1 * | 8/2007 | Sampson ................. H04Q 1/06 439/49 |
| 2011/0290955 A1 * | 12/2011 | Yu ........................ H05K 7/1491 248/70 |

* cited by examiner

*Primary Examiner* — James Wu
(74) *Attorney, Agent, or Firm* — Barry N. Young

(57) ABSTRACT

A cable assembly for organizing and managing multiple electrical cables connected to rack-mounted electronics equipment includes a pair of individually movable cable carriers, each comprising a pair of slider arms slideably disposed in corresponding slider arm guide channels connected to the vertical rails of an equipment rack, a crossbar connected between the slider arms, and a plurality of cable clips carried on the crossbar. The cable clips each comprise a plurality of parallel slots for securely capturing and holding cables in parallel order aligned with corresponding I/O ports on the electronics equipment. The slider arm guides have a plurality of detents and the slider arms have a releasable latch that cooperates with the detents to enable the cable carrier to be moved vertically for easy access to the electronics for maintenance.

9 Claims, 6 Drawing Sheets

CABLE MANAGEMENT ASSEMBLY

BACKGROUND

This invention relates generally to electronics equipment racks and cabinets, and more particularly to apparatus and methods for organizing and managing multiple electrical cables connected to such electronics equipment.

Organizing and managing electrical cables connected to electronics equipment has always presented problems, particularly for installations having a plurality of electronics enclosures mounted in a rack or cabinet, such as in a computer data or network center, that have multiple input/output (I/O) interconnecting cables. A standard rack-mounted solid state memory, network switch or appliance may have, for instance, as many as 24, 48 or 96 I/O cables. Maintaining such a large number of cables in an organized orderly arrangement to avoid a "rat's nest" of randomly arrayed cables in a rack or cabinet is a challenge. Typically, electrical interconnecting cables are bundled together in groups and held together with cable ties, clamps or enclosed in a spiral plastic sheath, or the like. While such arrangements can avoid random arrays of cables and afford some organization, they are not necessarily the most efficient or effective approach, and they can present other problems.

Cable bundling is not convenient, for example, where it is necessary to change or reroute a cable, to access the equipment in place in the rack, or where it is necessary to pull a piece of electronics equipment out of the rack for maintenance or replacement. On such occasions, the cables generally must be disconnected to enable the equipment to be moved or to afford access, and the cables then reconnected when the equipment is replaced. This necessitates each of the cables being labeled to identify it and to enable it to be reconnected to a proper port of the electronics equipment. This can be error prone. Moreover, cable bundles may result in a cable being bent at an angle sufficiently acute to cause damage to the cable or to its connector, or may otherwise degrade the cable's electrical performance, things which may be difficult to detect. Additionally, cable bundles may restrict air flow and inhibit cooling of electronics in the rack.

It is desirable to provide cable organization and management arrangements that avoid the foregoing and other problems associated with managing and organizing cables connected to electronics equipment, and it is to these ends that the present invention is directed.

BRIEF DESCRIPTION OF THE DRAWINGS

FIG. 5, comprising

DESCRIPTION OF PREFERRED EMBODIMENTS

The invention is particularly well adapted to be used with electronics equipment comprising a rack-mounted housing enclosing electronics components such as a plurality of field-replaceable/field-serviceable electronics modules, such as solid state flash memory modules, having a multiplicity of cables such as input/output (I/O) cables connected thereto, and will be described in that environment. As will be appreciated, however, this is illustrative of only one utility of the invention, and the invention may be employed to manage and organize cables in other environments and with other types of electronics equipment.

Figure 1:
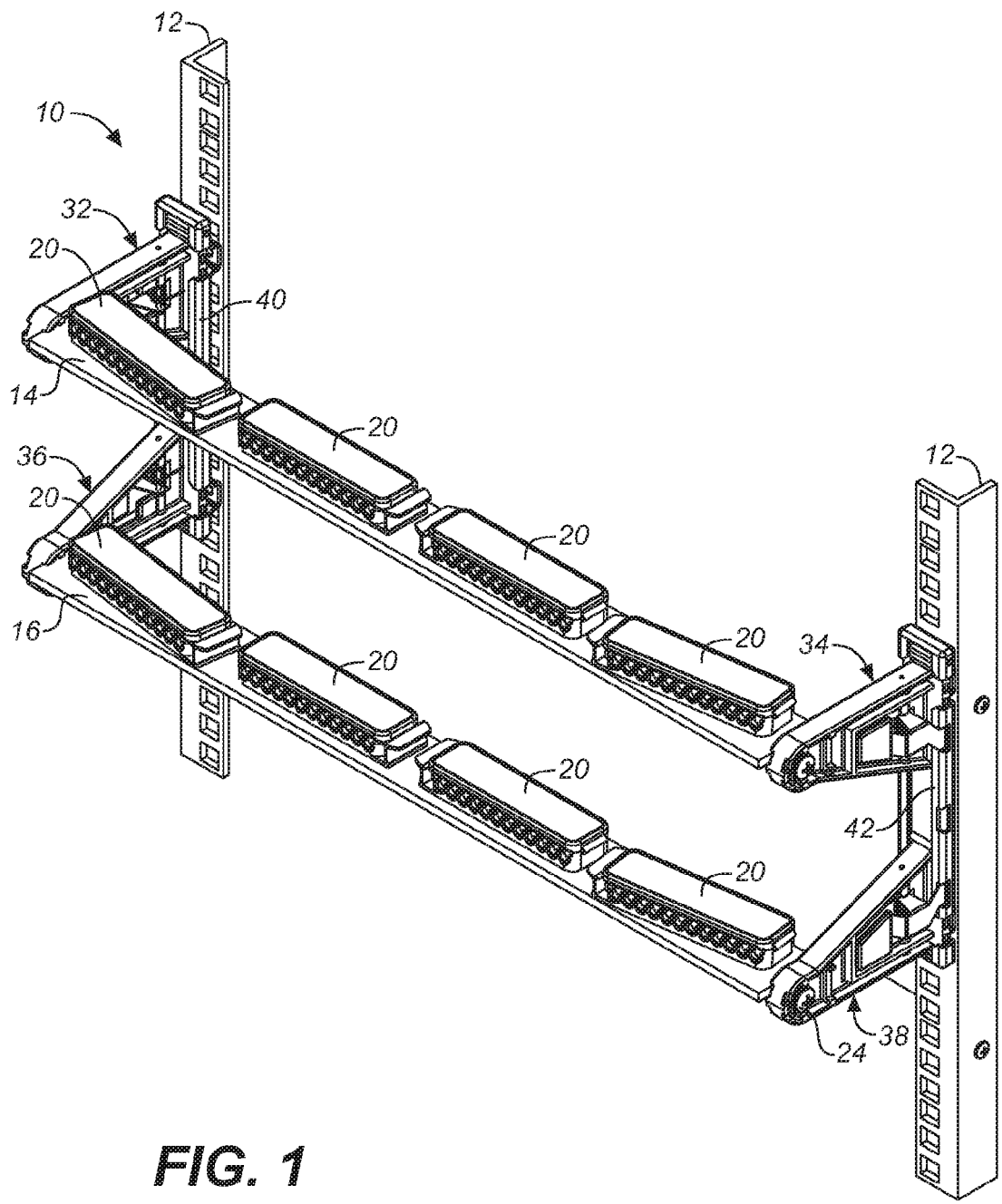
FIG. 1 is a perspective view of an embodiment of a cable management assembly in accordance with the invention for use with rack-mounted electronics equipment.
Figure 2:
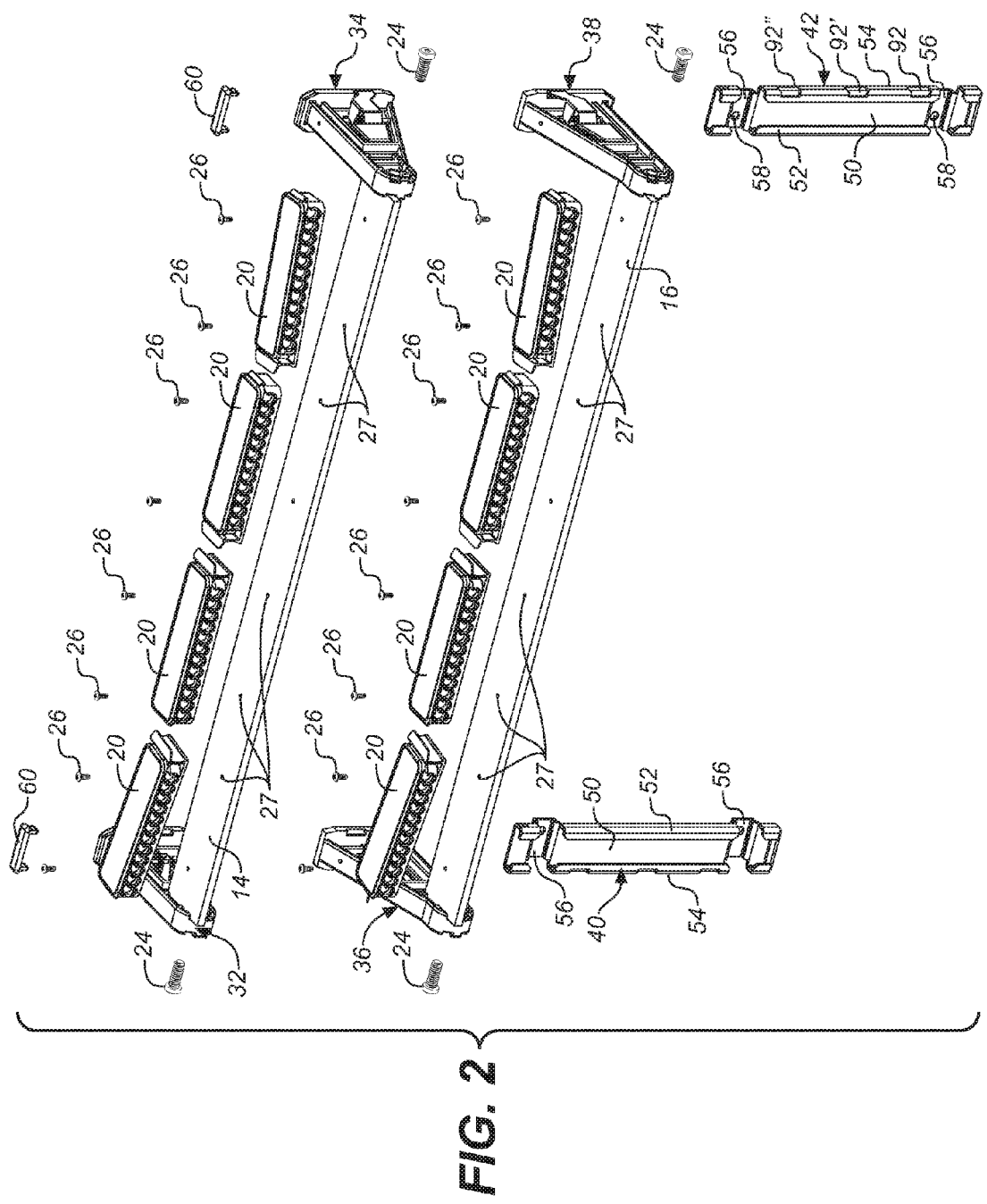
FIG. 2 is an exploded perspective view of the cable management assembly of FIG. 1.

FIG. 1 is a perspective view of a cable management assembly 10 in accordance with an embodiment of the invention showing the cable management assembly connected to a pair of vertical side rails 12 of a standard RETMA electronics equipment rack or an equipment cabinet. FIG. 2 is an exploded perspective view of the cable management assembly 10 showing additional details of its construction and components. As will be described, the cable management assembly is designed and constructed to afford good organization and management of input/output (I/O), data, network and other types of cables connected to electronics equipment in a rack or cabinet while minimizing strain on the cables, their connectors, and associated equipment ports, and the possibility of damage. A cable management assembly in accordance with the invention also affords optimal system airflow for cooling and ease of access to field-replaceable units (FRUs) for replacement or servicing. The embodiment of the cable management assembly 10 described herein comprises two movable cable carriers formed to hold, organize and manage a multiplicity (ninety-six, for example) of electrical cables connected to electronics equipment. It will be appreciated, however, that the cable management assembly may be readily adapted to organize and manage fewer or greater numbers of cables, as well as different types and sizes of cables.

Referring to FIGS. 1 and 2, in a preferred embodiment, a cable management assembly 10 in accordance with the invention may comprise a pair of upper and lower (in the figures) crossbars 14 and 16, respectively, as of extruded aluminum or other suitable material. Each of the crossbars may carry four or more cable clips 20, for instance, spaced along the crossbar. Each cable clip is formed to secure a plurality, eight, for instance, of I/O, data, network or other types of electrical cables. As will be described, the clips organize and maintain the cables separated and fanned out in an orderly manner. The crossbars may be connected at their opposite ends, as by screws 24 threaded into the ends of the crossbars, to corresponding left and right slider arms 32, 34, respectively, for upper crossbar 14 and to left to right slider arms 36, 38, respectively, for lower crossbar 16. The cable clips 20 may be secured to the crossbars by fasteners such as screws 26 threaded into holes 27 of the crossbars. As shown in FIGS. 1 and 2, the cable clips 20 at the two opposite ends of each crossbar 14 and 16 may be angled slightly to point outwardly from the ends of crossbars towards the rails 12, as shown, to reduce sharp bends in the cables when routing the cables to the sides of the rack. Each pair of left and right slider arms, their connected crossbar, and associated cable clips comprise a movable cable carrier. In a preferred embodiment, the cable management assembly 10 may comprise two such upper and lower movable cable carriers.

The pairs of left and right slider arms 32, 34 and 36, 38 of the movable cable carriers of the cable management assembly may be disposed for sliding movement within corresponding left and right channel-shaped slider arm guide brackets 40, 42, respectively, that are mounted to the corresponding left and right vertical side rails 12 of the rack, as by nuts and bolts (not shown). The guide brackets may be sized and mounted on the rails such that when the slider arms and crossbars of the movable cable carriers are in their normal positions the cables secured in the cable clips are positioned vertically aligned with their corresponding ports of the electronics equipment without the necessity of any substantial bending of the cables. This arrangement also opens the vertical space in the rack to afford access to other modules without the necessity of moving the crossbars. As will be described in more detail below, each of the upper and lower movable cable carriers comprising the upper and lower crossbars with their cable clips may be separately moved vertically upwardly or downwardly by predetermined amounts by simultaneously sliding the left and right slider arms of each crossbar upwardly or downwardly together in the left and right slider arm guide brackets. This enables the groups of cables secured in the cable clips 20 carried on each crossbar to be moved vertically to improve access to FRUs and other components of the electronic equipment, as will be described.

Figure 3:
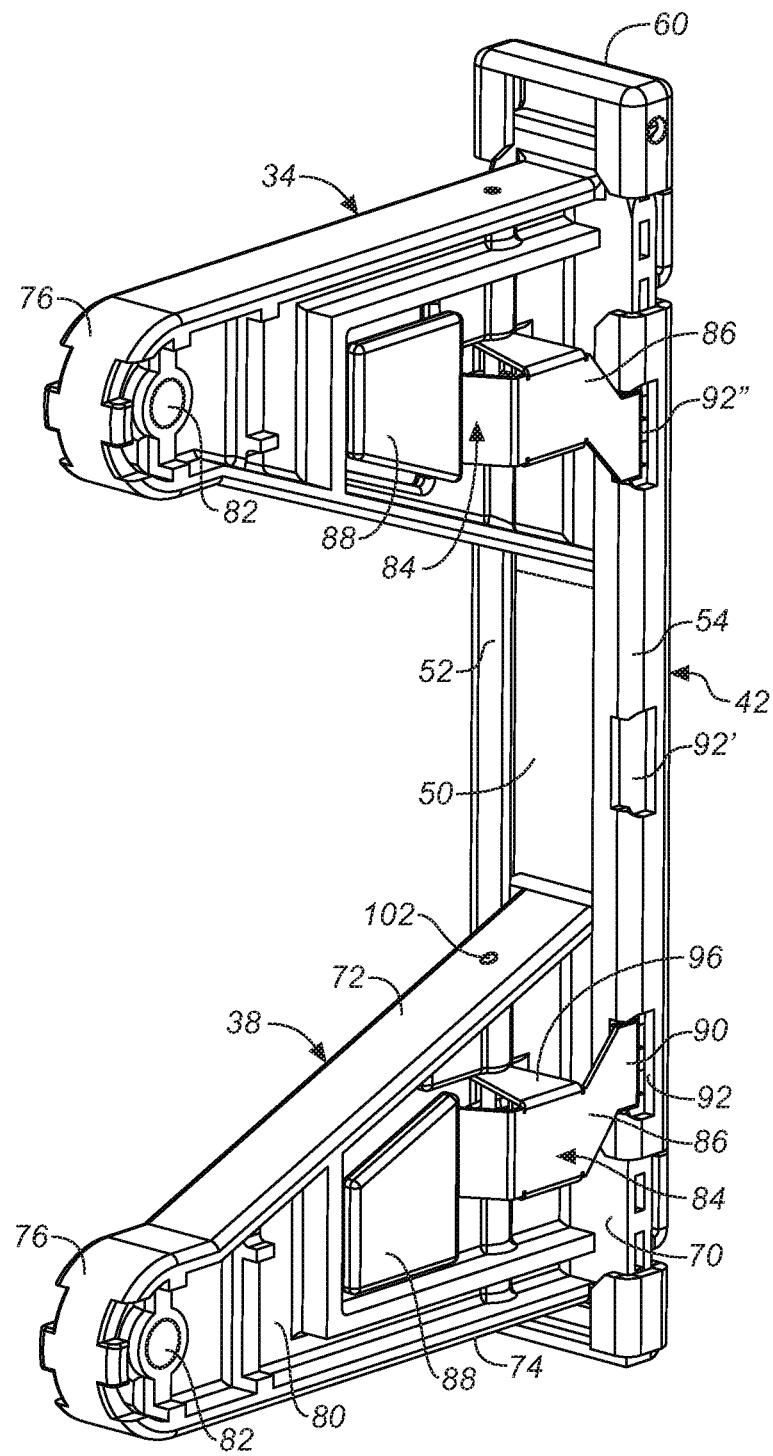
FIG. 3 is a perspective view of a right side slide assembly of the cable management assembly of FIG. 1, the figure showing a pair of slider arms assembled within a slider arm guide of the cable management assembly.
Figure 4:
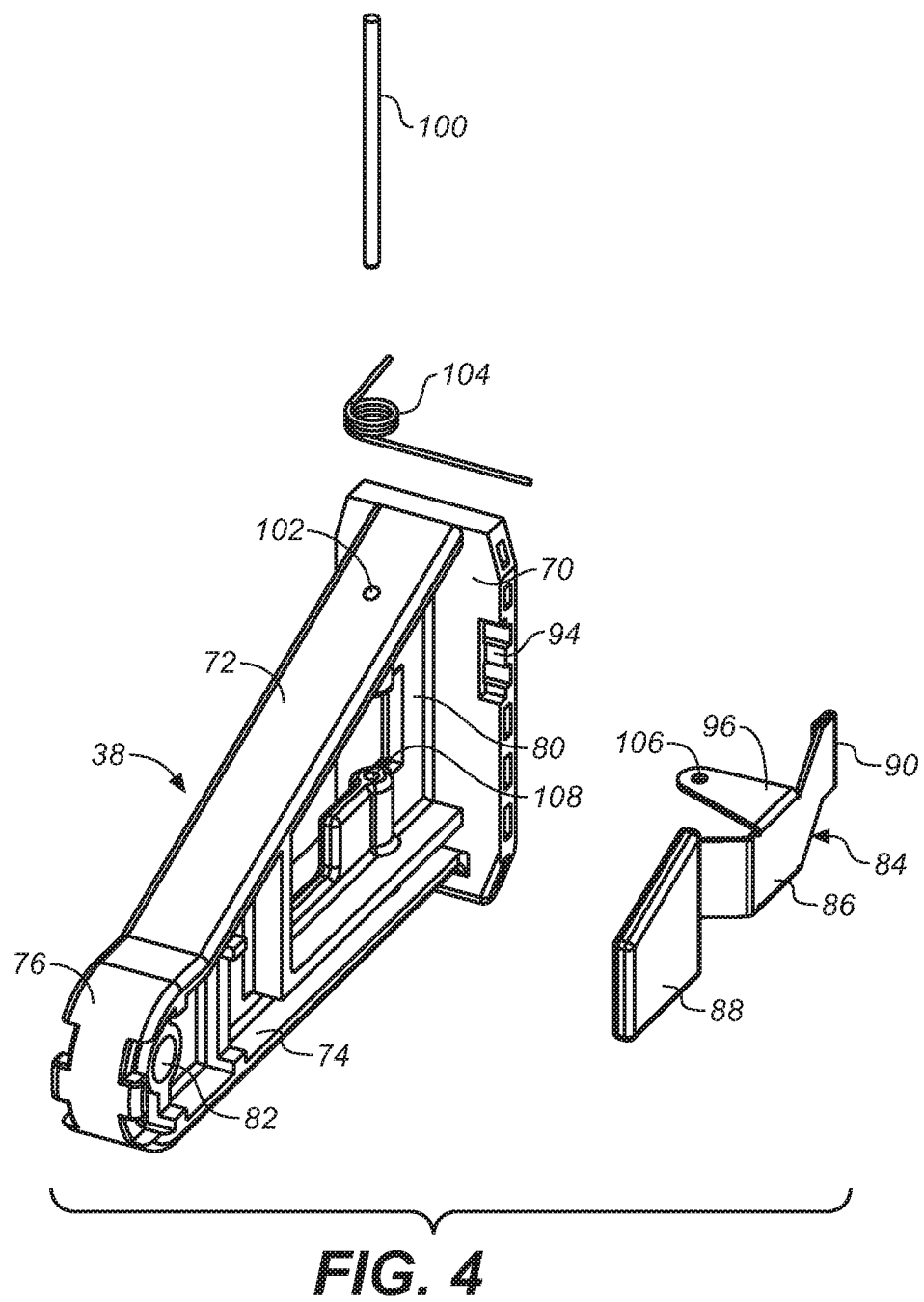
FIG. 4 is an exploded perspective view illustrating the construction of a slider arm.

FIG. 3 is a perspective view that illustrates details of the right side upper and lower slider arms 34 and 38 assembled with the right side slider arm guide bracket 42 of the cable management assembly. FIG. 4 is an exploded perspective view of one of the right side slider arms, e.g., slider arm 38, and shows details of the construction of an embodiment of the slider arm. FIG. 4 is also useful for describing the cooperation between the slider arm 38 and the slider arm guide bracket 42. The right side upper and lower slider arms 34 and 38 may be substantially the same, except that the upper and lower slider arms on each side may be mirror images of each other about a horizontal plane. The left side upper and lower slider arms 32 and 36 may also be substantially the same and mirror images of each other, and they and the left side slider arm guide bracket 40 may be mirror images of the right side slider arms 34 and 38 and guide bracket 42.

Referring to FIGS. 2 and 3, the slider arm guides may each comprise an elongated bracket, as of steel, for example, having a flat base 50 and longitudinally extending sidewalls 52, 54 that extend upwardly and inwardly relative to the flat base to form a channel and impart a substantially C-shaped cross-section to the guide bracket. As best illustrated in FIG. 2, adjacent each of its ends the bracket may have a shallow flat recessed portion 56 with a hole 58 for receiving a bolt for securing the bracket to a vertical rail. The open ends of the bracket may be closed with end caps 60.

As best illustrated in the exploded view of FIG. 4, slider arm 38 may have a flat planar base 70 and an arm structure comprising upper and lower arm members 72, 74, respectively, projecting outwardly from the planar base and coming together at their outer ends to form a triangular-shaped arm structure with a rounded apex end portion 76, said arm structure projecting outwardly substantially normal to the base 70. The flat base 70 of the arm is sized to be captured within the C-shaped channel of the slider arm bracket for sliding movement on the base 50 within the bracket channel.

A structural reinforcing web 80 interior to the arm 38 may interconnect and extend between the upper and lower arm members 72, 74 and the base, as shown, to provide structural support to the arm. Interior to the arm at its outer end 76, the web may have a hole 82 formed to accept a screw 24 (see FIG. 2) to connect the arm to crossbar 14. The slider arm comprising the base, the arm members and the web is preferably formed as a unitary rigid structure by injection molding a plastic material to the shape illustrated in the drawings. A preferred material for this purpose is Dupont™ Delrin® 900P acetal homopolymer resin, although, as will be appreciated, other materials may also be used.

Slider arm 38 may also be provided with a manually operable releasable latch 84 connected to the interior web 80 between the upper and lower arms 72, 74 for pivoting movement about a dowel pin 100, as will be described. As shown in FIG. 4, the latch may comprise a bent flat metal member 86, as of steel, formed to have a finger engaging portion 88 at one end of the latch member, and a latching end portion 90 at an opposite end of the latch member, as illustrated in the drawing. The latching end portion 90 of the latch member 86 may be formed cooperate with a detent, such as a notch 92, in the slider arm guide (see FIG. 3) and a corresponding notch 94 in a side of the base 70 to locate and hold the slider arm at a predetermined location within the slider arm guide, as will be described. The latching end 90 may be sized to enter the notch 92 in the slider arm and to extend through the side of the slider arm guide bracket into the notch 94 in the base to releasably connect the slider arm to the guide bracket. The latch member 86 may also be formed with inwardly projecting arms 96 positioned generally midway between ends 88 and 90 (one such arm being shown in FIG. 4) for connecting the latch member to the interior web 80 of the slider arm for pivotal movement about dowel pin 100. The dowel pin may be forced fitted to the slider arm by being inserted through a hole 102 in arm member 72, through a cooperating hole 106 in the latch member arm 96, through the center coil of a spring 104 and into a another hole 108 in a lower portion of web 80 adjacent the lower arm member 74. When assembled with the latch member 86, the spring 104 is arranged to bias the latch member 84 so that its latch end 90 is urged to enter a detent such as notch 92 in the sidewall 54 of the slide arm guide bracket and to enter the cooperating notch 94 of the base 70 of the slider arm.

As shown in FIG. 3, in addition to notch 92, the slider arm guide bracket 42 may be formed with a plurality of other notches in its sidewall 54 (two additional notches 92" and 92" being shown) forming detents. The latch member allows the slider arm 38 to be releaseably connected to the slider arm guide bracket at different predetermined locations as defined by the notches in the bracket. By simultaneously operating the latch members of corresponding left and right slide arms, the associated crossbar and the cables held by the cable clips carried on the crossbar may be disconnected from a detent and moved vertically to different locations in the rack, as previously described.

In the embodiment illustrated in the figures, the cable assembly is shown as comprising two (upper and lower) movable cable carriers each comprising a crossbar with cable clips and associated slider arms, and the slider arm guide bracket is shown as having one center notch between the upper and lower movable cable carriers to enable each carrier to be moved either upwardly or downwardly one position. As will be appreciated, however, the invention is not restricted to any particular number of cable carriers, or to slider arm guide brackets having any particular height or any particular number of detents.

Figure 5A:
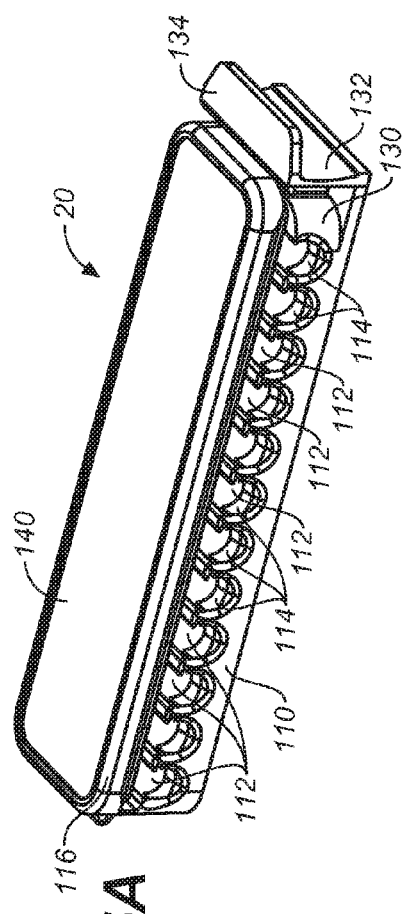
FIGS. 5A and 5B, are perspective views of a preferred embodiment of a cable clip assembly in accordance with the invention, FIG. 5A showing the cable clip in a closed position, and FIG. 5B showing the cable clip in an opened position.
Figure 5B:
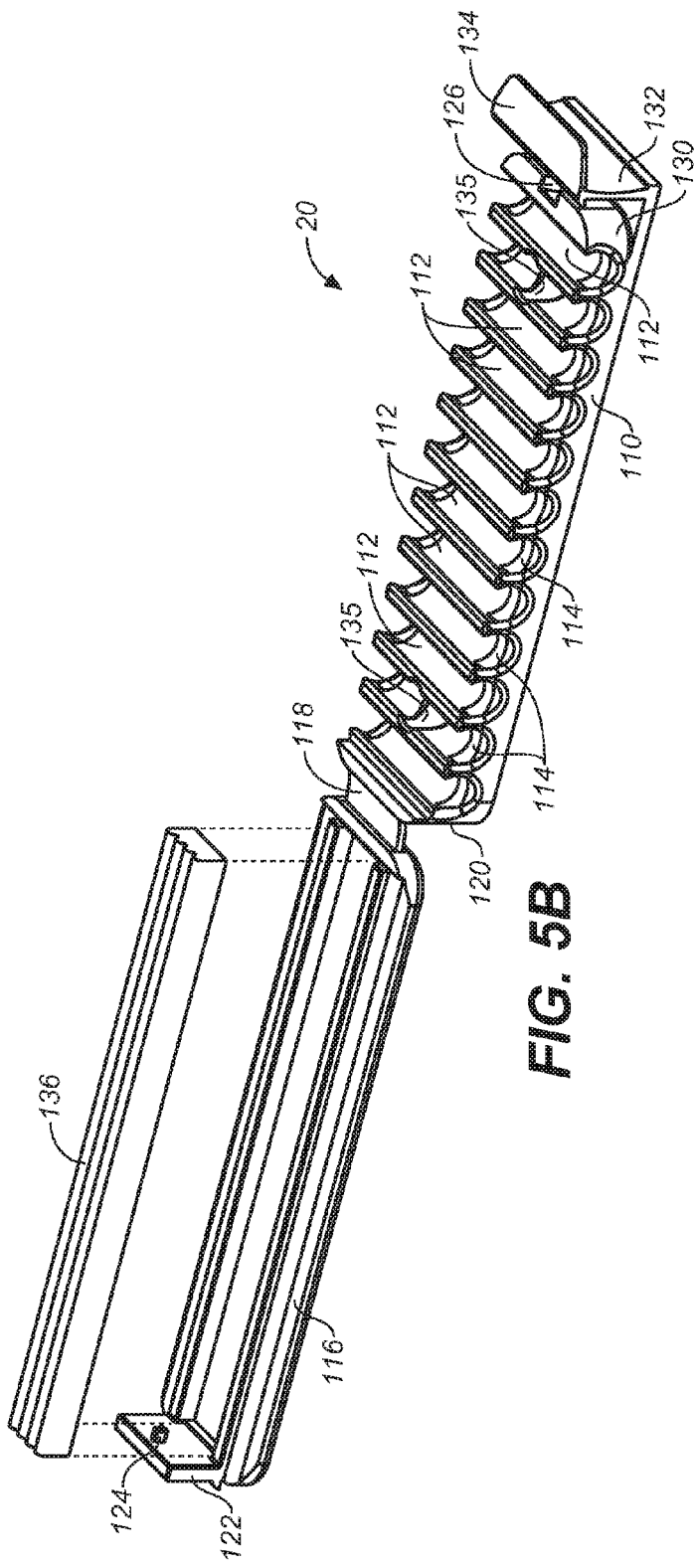

FIGS. 5A and 5B illustrate a preferred embodiment of a cable clip 20 in accordance with the invention, FIG. 5A showing the clip in a closed position and FIG. 5B showing the clip in an opened position. The cable clip is formed to hold securely and organized a plurality of cables spaced apart from one another. In the embodiment illustrated in the figures, the clip is formed to hold eight cables, although as may be appreciated, it may be formed to hold a fewer or a greater number of cables.

As shown, the cable clip may comprise an elongated base member 110 having formed thereon a plurality of semi-cylindrical parallel channels or slots 112 formed to receive and hold the cables aligned with corresponding ports of the electronics equipment when the associated cable carrier assembly is normally positioned. The channels are preferably sized relative to the cables so that the cables are captured securely and retained in the channels in an ordered fixed parallel relationship to one another. The clip is preferably formed of an elastomeric material that is sufficiently resilient to capture and securely hold the cables in the channels while enabling the cables to be removed easily from the channels. Preferably, each channel is formed with chamfered edges 114 to minimize sharp bends of the cables entering and exiting the channels of the cable clip. The clip may further comprise a lid 116 integrally connected to the base member 110 by a flexible "living" hinge 118 connected to an upstanding member 120 at one end of the base member to allow the lid 116 to be opened and closed over the base and the channels. The lid may have a depending member 122 at an opposite end of the lid from the living hinge with a projecting latch prong 124 that is adapted to be received in a slot 126 in a member 130 adjacent an end member 132 at an opposite end of the base from the living hinge when the lid is closed to latch the lid in closed position on the base. The clip may additionally have a finger-operated latch release 134 flexibly connected to the base by end member 132 that allows the lid to be unlatched and opened by rotating the lid about the living hinge 118. Preferably, the cable clip 20 is formed as a unitary structure by injection molding said elastomeric material to the shape illustrated in the figures, the elastomeric material being selected to have the appropriate degree of flexibility and resilience, such as polypropylene, to provide the characteristics described above. The base 110 may also have through-holes 135 for screws 26 to thread into holes 27 secure the base to a crossbar 14, 16, as indicated in FIG. 2. Alternatively, the clips may be secured to the crossbars or to other structure such as rails 12 by adhesive.

As shown in FIG. 5B, lid 116 may have affixed to its underside a soft cushion insert 136, as of foam rubber such as EPDM (ethylene propylene diene monomer), that lightly grips the cables when the lid is closed to ensure that the cables remain safely seated in their slots while enabling slight flexing of the cables to provide strain relief to the cables, connectors and ports in the event a cable is accidently pulled. The top surface 140 of the lid may be slightly depressed and formed to receive a decal or a label with indicia such as cable and/or port numbers to facilitate organizing the cables in the clips for connection to ports of the electronic equipment.

Figure 6:
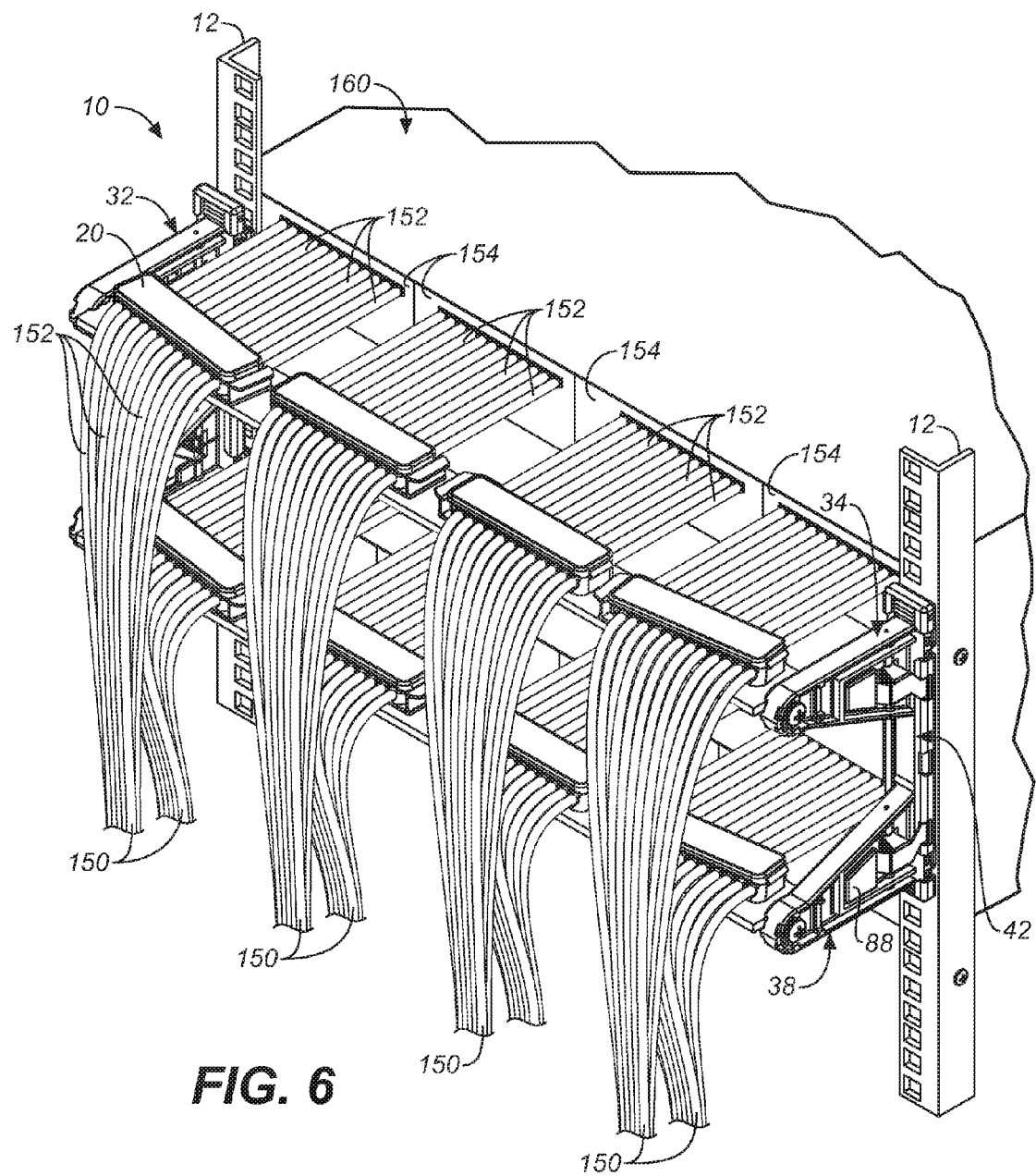
FIG. 6 is a perspective view showing the cable management assembly of FIG. 1 operating to organize and manage groups of electrical cables connected to electronics equipment mounted in a rack.

FIG. 6 shows an example of the cable management assembly 10 having two (upper and lower) movable cable carriers in operation for organizing and managing groups 150 of cables 152 connected to adjacent modules 154 of an electronics chassis or housing 160 that is mounted in the rack. As shown, the cable clips 20 of the movable cable carriers of the cable management assembly maintain the cables separated into parallel relationship in groups of cables and aligned with corresponding ports of the modules 154 of the electronics housing. The cables that exit from the cable clips may be bundled in groups 150, as shown, and fed to the sides of the rack, or otherwise routed directly to their destinations. To facilitate access to a module 154 or to a component of an adjacent electronics housing for replacement or service, the cables which are held in the clips 20 of an associated movable cable carrier and that connect to the module and to adjacent modules at the same level in the rack may be disconnected from the modules. The latches of the left and right slider arms connected to a crossbar of an associated movable cable carrier may then be released to unlock the slider arms from the slider arm bracket detents, and the slider arms (with the associated crossbar and cable clips) slid vertically in the slider arm channels to gain access to the desired module or component. Following service or replacement of the module or component, the slider arms and associate crossbar may be returned to their original position, locked in place, and the cables reconnected.

Advantageously, since it is not necessary to remove the I/O cables from the cable clips during this operation, upon returning the slider arms and crossbar of the movable cable carrier to the original position, the I/O cables will be properly organized and correctly aligned with their corresponding I/O ports of the electronics housing so that they may be readily and quickly reconnected without having to match cable identifiers to port identifiers. This reduces both chances of errors in reconnecting cables and minimizes the time required to restore the system to full operation.

As will be appreciated from the foregoing, a cable management assembly in accordance with the invention affords a number of advantages and conveniences in organizing and managing multiple cables. A cable management assembly in accordance with the invention is much more than simply a fixture to hold and organize cables to afford an orderly environment. It also affords real performance benefits by reducing electromagnetic coupling and interference, prevents data loss from signal degradation due to damage to cables and connectors, and minimizes blockage to airflow to prevent overheating and damage to electronics.

While the invention has been described with reference to preferred embodiments, it will be appreciated that changes to these embodiments may be made without departing from the principles of the invention, the scope of which is defined in the appended claims.

The invention claimed is:

1. A cable management assembly for organizing and managing a multiplicity of electrical cables connected to electronics equipment in a rack, comprising:
   a crossbar supporting a plurality of cable clips, each cable clip being formed to capture and hold a plurality of said electrical cables in ordered spaced relationship to one another;
   first and second slider arms connected to opposite ends of said crossbar;
   first and second slider arm guides connected to side rails of said rack, the first and second slider arms being respectively disposed for sliding movement within said first and second slider arm guides;
   each of said first and second slider arms having a latch formed to releasably connect each slider arm to a corresponding slider arm guide in which said slider arm is disposed to locate the slider arm at a predetermined position in said corresponding slider arm guide;

each said slider arm guide comprising a channel and each said slider arm comprising a base that is sized to be captured within and to slide within said channel; each said slider arm guide having a plurality of detents comprising a plurality of notches in a side of each said slider arm guide and formed to be engaged by said latch of one of said first and second slider arms to connect said one of said first and second slider arms at a plurality of predetermined locations of said corresponding slider arm guides; and wherein said latch comprises a latch portion formed to enter one of said notches in a slider arm guide and to extend into another cooperating notch in the base of said slider arm to connect said slider arm to the slider arm guide; and said latch of said first and second slider arms being operable to disconnect said slider arms from said slider arm guides to enable said first and second slider arms to be moved simultaneously within said slider arm guides to relocate said slider arms, said connected crossbar, said plurality of cable clips and said plurality of cables captured in said cable clips as a unit to a different position in said rack to afford access to said electronics equipment.

2. The cable management assembly of claim 1, wherein said notches comprise first notches formed in the first and second slider arm guides for cooperation with the first and second slider arms, respectively, to hold said crossbar at a first location so that said cables are held ordered in a predetermined relationship aligned with and connected to corresponding ports of the electronics equipment, and comprise second notched formed in the first and second slider arm guides to enable the crossbar to be moved and held at a second different location with the cables disconnected from said corresponding ports while maintaining the cables ordered in said predetermined relationship.

3. The cable management assembly of claim 1, wherein said latch comprises a member pivotally connected to said slider arm, and a spring urging said latch portion to enter said slider arm guide notch and said cooperating notch in said base of said slider arm.

4. The cable management assembly of claim 1, wherein each of said slider arms comprises first and second arm members extending outwardly from said base to form a triangularly-shaped arm structure that is connected to said crossbar at an apex end of said arm structure, and a reinforcing web extending between the first and second arm members and the base to form a unitary structure.

5. The cable management assembly of claim 1, wherein said plurality of cable clips comprise a plurality of slots, and are arranged on said crossbar to hold said plurality of cables in corresponding slots in a predetermined order in parallel spaced relationship.

6. The cable management assembly of claim 1, wherein the plurality of cable clips include cable clips located at opposite ends of said crossbar that are angled outwardly relative to the crossbar towards the sides of the rack to minimize bending of the electrical cables captured in said clips that are routed to the sides of the rack.

7. The cable management assembly of claim 1, where each cable clip has a plurality of slots formed on a base member connected to said crossbar, each of the slots each being sized to securely hold an electrical cable while enabling said electrical cable to be removed from said slot, and a lid attached to said base, the lid being formed to cover said base and said cables in said slots, and to be latched to said base to hold the cables within said slots.

8. The cable management assembly of claim 7, wherein said cable clip is formed as a unitary member with said lid connected at one side to said base by a living hinge to enable said lid to be opened and closed, and with a latch formed at an opposite side of said lid to latch the lid in closed position on said base.

9. The cable management assembly of claim 8, wherein said cable clip comprises resilient molded plastic material to form said unitary member.

\* \* \* \* \*